United States Patent
Giraud et al.

(10) Patent No.: US 11,528,027 B2
(45) Date of Patent: Dec. 13, 2022

(54) MOTORCYCLE WITH HAPTIC FEEDBACK

(71) Applicant: Damon Motors Inc., Vancouver (CA)

(72) Inventors: Damon Jay Giraud, North Vancouver (CA); Dominique Kwong, Coquitlam (CA)

(73) Assignee: Damon Motors Inc., Vancouver (CA)

( * ) Notice: Subject to any disclaimer, the term of this patent is extended or adjusted under 35 U.S.C. 154(b) by 168 days.

(21) Appl. No.: 17/180,739

(22) Filed: Feb. 20, 2021

(65) Prior Publication Data
US 2021/0171057 A1    Jun. 10, 2021

Related U.S. Application Data

(63) Continuation of application No. 16/644,458, filed as application No. PCT/CA2018/051080 on Sep. 6, 2018, now Pat. No. 10,926,780.

(60) Provisional application No. 62/580,610, filed on Nov. 2, 2017, provisional application No. 62/570,028, filed on Oct. 9, 2017, provisional application No. 62/554,697, filed on Sep. 6, 2017.

(51) Int. Cl.
*B60Q 9/00* (2006.01)
*B60W 50/16* (2020.01)
*B62K 11/14* (2006.01)
*H03K 17/96* (2006.01)
*B62J 25/06* (2020.01)

(52) U.S. Cl.
CPC .............. *H03K 17/96* (2013.01); *B60Q 9/00* (2013.01); *B60Q 9/008* (2013.01); *B60W 50/16* (2013.01); *B62J 25/06* (2020.02); *B62K 11/14* (2013.01); *B60W 2300/36* (2013.01); *H03K 2217/96062* (2013.01)

(58) Field of Classification Search
None
See application file for complete search history.

(56) References Cited

U.S. PATENT DOCUMENTS

| | | | | |
|---|---|---|---|---|
| 9,802,537 B2 * | 10/2017 | Tetsuka | ................. | B60W 50/16 |
| 9,829,338 B2 * | 11/2017 | Ward | .................... | A45B 25/14 |
| 2015/0307022 A1 * | 10/2015 | Nelson | ................... | B62D 1/046 |
| | | | | 701/36 |

* cited by examiner

*Primary Examiner* — Todd Melton
(74) *Attorney, Agent, or Firm* — Damien G. Loveland

(57) ABSTRACT

Haptic devices are installed in a motorcycle's handlebars, footpegs and seat to provide the rider with alerts that relate to hazards. The alert is provided before the rider notices the hazard, or before the rider reacts to the hazard. By giving advance warning, a rider is given extra time to avert a potential accident. The alerts also provide a direct instruction to the rider as to what to do to avoid the accident.

20 Claims, 4 Drawing Sheets

MOTORCYCLE WITH HAPTIC FEEDBACK

TECHNICAL FIELD

This application relates to a motorcycle equipped with haptic devices. More specifically, it relates to a motorcycle equipped with haptic feedback devices in the handlebars, footpegs and/or seat.

BACKGROUND

Motorcycles are fundamentally unsafe, with riders being many times more likely to die in an accident than car drivers. Every year, 160 million motorcycles are sold, which is double the number of cars. South East Asia accounts for 86% of the motorcycles that are sold, where they outnumber cars by a factor of ten.

In South East Asia, motorcycle ridesharing is fast becoming the primary mode of travel. Rideshare operators are projected to surpass 1 million rides per day. It is especially important for these companies to use the safest possible motorcycles.

SUMMARY OF INVENTION

The present invention is directed to a motorcycle equipped with haptic feedback devices in the handlebars, foot pegs and/or seat, which provide the rider with an early warning of a hazard. The haptic devices, depending on their pattern of activation, instruct the rider to back off, slow down, swerve left or right, or take other corrective action.

Disclosed herein is a motorcycle comprising: at least one haptic device configured to provide haptic feedback to a rider of the motorcycle; and a control unit connected to the haptic device(s) and configured to detect a condition, and activate at least one of the haptic device(s) in response to the condition.

Also disclosed herein is a method for warning a rider of a motorcycle of a hazard comprising: attaching, to the motorcycle, at least one haptic device configured to provide haptic feedback to the rider; attaching, to the motorcycle, a control unit; connecting the control unit to the haptic device(s); detecting, by the control unit, a condition; and activating, by the control unit, at least one of the haptic device(s) in response to the condition.

Further disclosed herein is a kit of parts for attachment to a motorcycle, the kit comprising: at least one haptic device configured to mount on the motorcycle and provide haptic feedback to a rider of the motorcycle; a control unit configured to mount on the motorcycle, connect to the haptic device(s), detect a condition, and activate at least one of the haptic device(s) in response to the condition; and one or more connectors configured to connect the haptic device(s) to the control unit.

BRIEF DESCRIPTION OF DRAWINGS

The following drawings illustrate embodiments of the invention, which should not be construed as restricting the scope of the invention in any way.

DESCRIPTION

A. Glossary

The term "electro-active polymer (EAP)" refers to polymeric materials that expand, shrink or bend when a voltage is applied to them. The motive force may be based on coulombic attraction (electronic EAP), in which case the working conditions are dry and high voltage. Alternately, the motive forces may be based on transport of ions (ionic EAP), in which case the working conditions are wet and low voltage.

The term "engine control unit (ECU)" refers to the computer that controls and monitors various components and states of an engine.

The term "haptic" refers to both the sense of touch (tactile feedback) and the ability to detect shape and forces (kinesthetic feedback). Tactile feedback is used to detect surface texture, temperature and vibrations, for example. Kinesthetic feedback is used to detect changes in shape, motion, forces and weights.

The term "module" can refer to any component in this invention and to any or all of the features of the invention without limitation. A module may be a software, firmware or hardware module.

The term "processor" is used to refer to any electronic circuit or group of circuits that perform calculations, and may include, for example, single or multicore processors, multiple processors, an ASIC (Application Specific Integrated Circuit), and dedicated circuits implemented, for example, on a reconfigurable device such as an FPGA (Field Programmable Gate Array). The processor performs the steps in the flowcharts, whether they are explicitly described as being executed by the processor or whether the execution thereby is implicit due to the steps being described as performed by code or a module. The processor, if comprised of multiple processors, may be located together or separate from each other.

The term "rider" refers to the person who drives or controls a motorcycle, and is to be distinguished from a person who rides pillion on the motorcycle or otherwise as a passenger.

B. Industrial Applicability

If motorcycle riders on the road could be given just one extra second to avoid a hazard, tens of thousands of accidents could be prevented each year. The present invention provides motorcycle riders with an advance warning of a hazard, either before the rider realizes it, or if the rider fails to react to it. While the advance is sometimes brief, it still provides the rider with valuable thinking and reaction time in which to take evasive action.

C. Exemplary Embodiments

Figure 1:
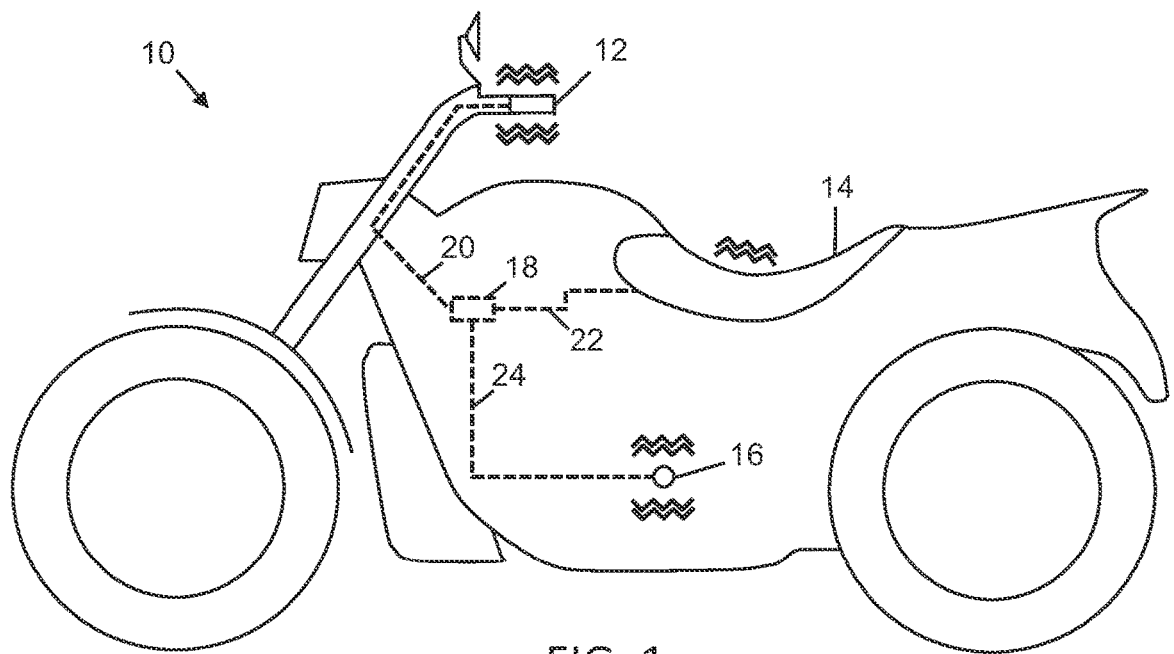
FIG. 1 is a schematic side view of a motorcycle showing haptically enabled handlebars, seat and footpegs, in accordance with an embodiment of the present invention.

Referring to FIG. 1, there is shown a motorcycle 10 equipped with haptic handlebars 12, a haptic seat 14 and haptic footpegs 16. The handlebars 12 provide haptic feedback to the rider by vibrating or changing form. The seat 14 provides haptic feedback to the rider by vibrating, either in a central location, on the left side, on the right side, or in multiple locations. The footpegs 16 provide haptic feedback to the rider by vibrating. The handlebars 12, seat 14 and footpegs 16 are all activated simultaneously or individually, or all on the left side or all on the right side, and the activation is either pulsed or continuous depending on the message that is to be communicated to the rider of the motorcycle. Where the haptic devices produce vibration, the magnitude and frequency of the vibration, and its duty cycle, are such as to be clearly distinguishable from the normal vibrations of the motorcycle. Each different message alerts the rider of a different hazard.

The haptic devices 12, 14, 16 are connected to a control unit 18 via connecting cables 20, 22, 24. The control unit 18 provides power to the haptic devices and sends signals to them when an alert is to be given to the rider. The control unit 18 is located piggyback on the ECU. The haptic devices 12, 14, 16, the control unit 18 and the connectors 20, 22, 24 may be installed in the motorcycle during its production, or they may be provided as a retrofit kit for installation after production.

Figure 2:
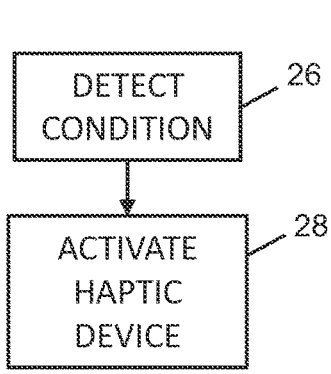
FIG. 2 is a flowchart of the main steps that the haptically enabled motorcycle takes, in accordance with an embodiment of the present invention.

Referring to FIG. 2, a flowchart shows the keys steps that the control unit 18 undertakes. In step 26, the control unit 18 detects a condition that is representative of a hazard to the rider of the motorcycle 10. The condition is detected by the control unit 18 receiving and analyzing signals from sensors on the motorcycle 10 that are connected to the control unit, receiving and analyzing signals from the engine control unit (ECU) of the motorcycle, and/or receiving and analyzing signals originating externally of the motorcycle. In step 28, the control unit 18 activates one or more of the haptic devices 12, 14, 16 in response to the control unit detecting a condition. The control unit 18 activates the haptic devices by sending one or more electrical signals to them.

Figure 3:
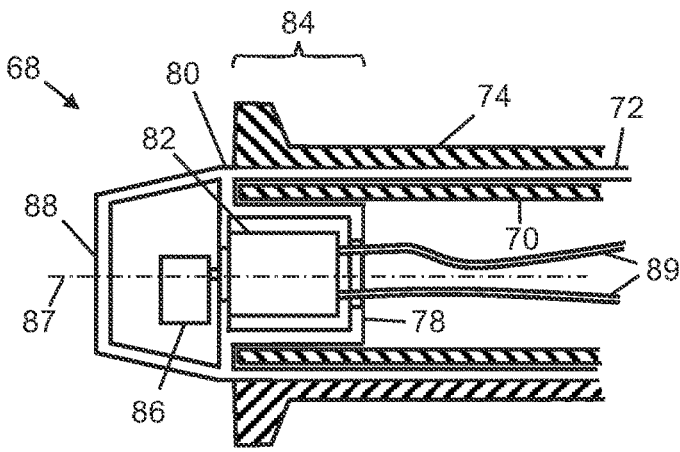
FIG. 3 is a schematic cross-sectional diagram of a rotatable handlebar equipped with an eccentrically rotating mass, in accordance with an embodiment of the present invention.

Referring to FIG. 3, an exemplary haptic handlebar 68 is shown. The main structure of the handlebar 68 is a fixed, non-rotating metal tube 70, about which a further tube 72 rotates or twists to control the throttle of the motorcycle. The rotatable tube 72 is surrounded by a rubber grip 74. A rigid mount 78 is fastened rigidly to the end 80 of the rotating handlebar tube 72. The mount 78 rigidly supports a motor 82 in the end region 84 of the handlebar 68. The motor 82 has an eccentrically mounted mass 86 attached to its spindle. As an example only, the mass can be 3 g centered 1 cm from the axis of rotation. When the motor 82 is operated, the rotation of the eccentrically mounted mass 86 causes the motor to vibrate in circular motion in a plane perpendicular to the axis 87 of the handlebar 68. The mount 78 also incorporates a stud cover 88, which covers the eccentrically mounted mass 86. Cables 89 connect the motor 82 to the control unit 18. It is important that the structure and fitting of the mount 78 are sturdy and rigid enough to efficiently transmit vibratory motion from the motor 82 to the tube 72 and grip 74 of the handlebar 68.

Figure 4:
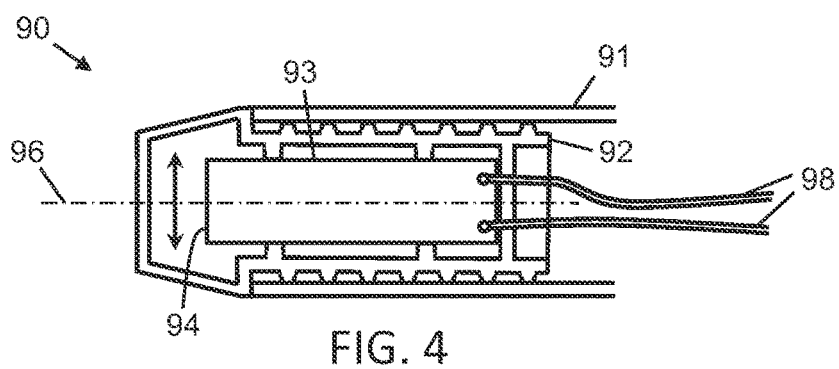
FIG. 4 is a schematic cross-sectional diagram of a handlebar equipped with a piezoelectric vibrator, in accordance with an embodiment of the present invention.

Referring to FIG. 4, an alternate embodiment of a haptic handlebar 90 is shown. This handlebar 90 has a structural tube 91 into which a rigid mount 92 is fastened. The mount 92 rigidly supports a linear piezoelectric actuator 93. When the actuator 93 is driven, its end 94 vibrates perpendicularly to the axis 96 of the handlebar 90 and actuator, in a direction of the double-headed arrow. A rigid structure and snug fitting of the mount 92 are important so that vibrational forces from the actuator 93 are transmitted through the mount to the structural tube 91 of the handlebar 90. Cables 98 connect power and transmit signals to the actuator 93. A grip may be present around the tube 91.

Figure 5:
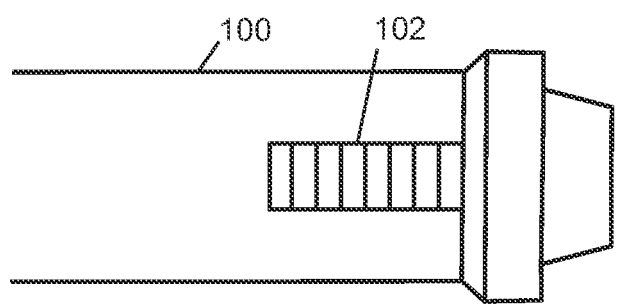
FIG. 5 is a schematic top view of a handlebar equipped with an electro-active polymer strip, in accordance with an embodiment of the present invention.
Figure 6:
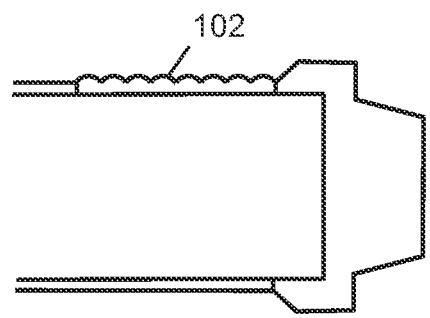
FIG. 6 is a schematic cross-sectional side view of the handlebar of FIG. 5, when the strip is not activated.
Figure 7:
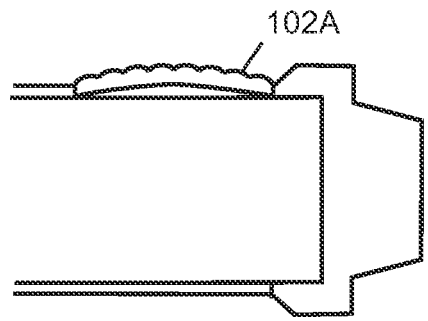
FIG. 7 is a schematic cross-sectional side view of the handlebar of FIG. 5, when the strip is activated.

FIG. 5 shows a handlebar 100 with an electro-active polymer (EAP) strip 102 on (or in) the top, outer region of the handlebar. FIG. 6 shows a cross-sectional view of the handlebar 100, where the EAP strip 102 is not activated. FIG. 7 shows a cross-sectional view of the handlebar 100, where the EAP strip is activated, and shown with deformed profile 102A in which the strip is bowed upwards. The extent of the deformation of the EAP strip is sufficient to be detected by a rider holding the handlebar 100. The position of the EAP strip 102 is chosen so as to press on the most sensitive part of the hand when the rider is holding the handlebar normally. In other embodiments, the EAP strip may be positioned differently on the handlebar, or there may be two or more such EAP strips on each handlebar. The EAP strip 102 may be integrated in the flexible rubber grip of the handlebar. The EAP may be over-molded with the elastomer that is bonded to the stud cover as one part.

Figure 8:
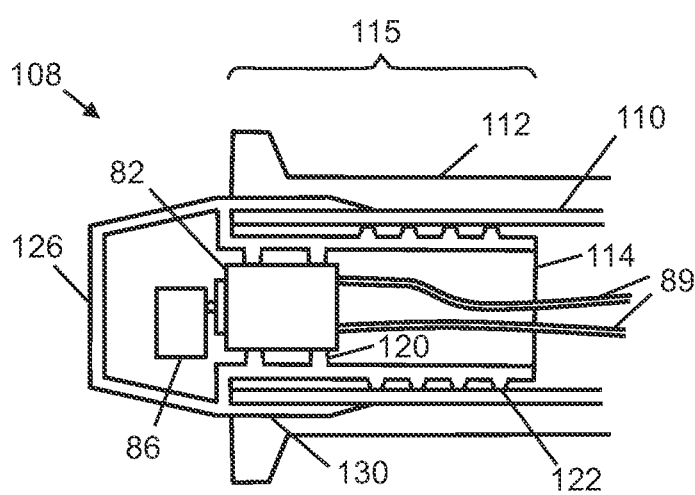
FIG. 8 is a schematic cross-sectional diagram of a fixed handlebar equipped with an eccentrically rotating mass and resonance booster, in accordance with an embodiment of the present invention.

Referring to FIG. 8, an alternate haptic handlebar 108 is shown. The main structure of the handlebar 108 is a fixed, non-rotating tube 110, typically made from metal. The tube 110 is surrounded by a rubber grip 112. A rigid mount 114 is inserted into and fastened to the end region 115 of the handlebar 108. The mount 114 supports a motor 82 in the end region 115 of the handlebar 108. The motor 82 has an eccentrically mounted mass 86 attached to its spindle. The motor 82 is supported by internal ridges 120 projecting inwards from an inner surface of the mount 114. The mount 114 is located firmly in place inside the handlebar tube 110 by ridges 122 projecting outwards from an external surface of the mount. The mount 114 also incorporates a stud cover 126, which covers the eccentrically mounted mass 86. Cables 89 connect the motor 82 to the control unit 18. The structure and fitting of the mount 114 are sturdy and rigid enough to efficiently transmit vibratory forces from the motor 82 to the tube 110 and grip 112 of the handlebar 108.

Figure 9:
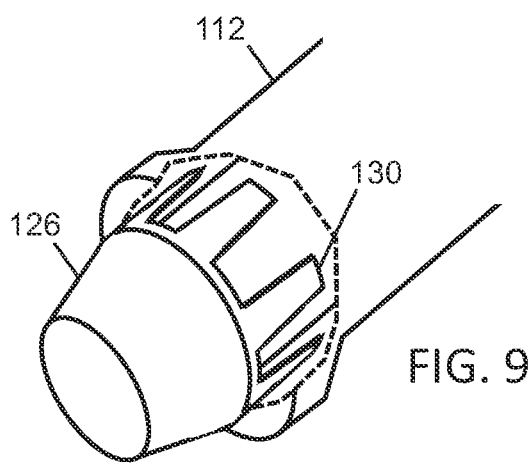
FIG. 9 is a schematic perspective view of a handlebar of FIG. 8.

A resonance booster 130 projects from the mount 114, and is located between the tube 110 and the rubber grip 112. FIG. 9 shows that the resonance booster 130 is comprised of fingers, which magnify the vibrational force generated by the eccentrically rotating mass 86, and/or bring the vibrational forces closer to the rider's hand. This helps the vibrational motion to penetrate the smaller thickness of rubber handgrip so that it is more easily detectable by the rider. The stud cover 126, mount 122 and resonance booster 130 may be of unitary construction, or may be connected together as separate components.

Figure 10:
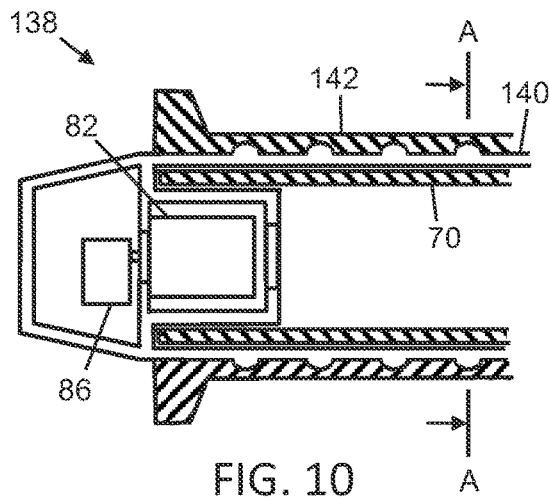
FIG. 10 a schematic cross-sectional diagram of a handlebar with nodules, in accordance with an embodiment of the present invention.
Figure 11:
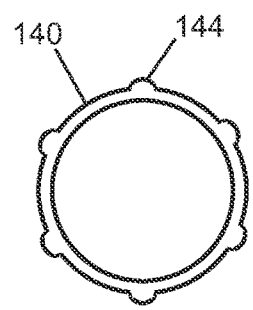
FIG. 11 is a cross-sectional view of the handlebar of FIG. 10 taken along section A-A.

Referring to FIGS. 10 and 11, an alternate handlebar 138 is shown, which is configured to help transmit vibrations from the motor 82 more efficiently to the outside of the handlebar. Mounted around an inner, fixed tube 70 of the handlebar 138 is a rotatable portion 140, which is covered with rubber grip 142. Nodules 144 project outwards from the outer surface of the rotatable tube 140, and are located in corresponding dimples or compresses areas on the inner surface of the grip 142. The nodules 144 permit the vibrations generated by the rotating eccentric mass 86 to be transmitted to the outer surface of the grip 142 via a shorter path through the rubber material of the grip. This results in less attenuation of the vibrations compared to when the nodules 144 are not present. In other embodiments, the shape, position and form of the nodules or other raised bumps may be different to those shown here.

The footpegs 16 are of a similar construction to that of the handlebars shown in FIGS. 3, 8 and 10, in that they include a motor with an eccentrically mounted mass on its spindle. They can also be of similar construction to that of FIG. 4, in that they are configured with a piezoelectric actuator.

Figure 12:
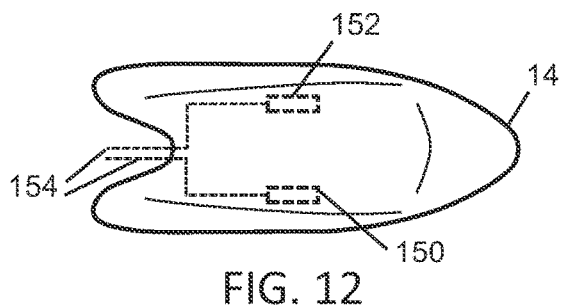
FIG. 12 is a schematic plan view of a haptically enabled motorcycle seat, according to an embodiment of the present invention.

FIG. 12 shows a haptically enabled motorcycle seat 14, in which is embedded two haptic devices 150, 152, on the left and the right of the seat respectively. In other embodiments, there may be a different number of haptic devices embedded in the seat. The devices are embedded just below the upper surface of the seat so that the vibrations are transmitted to the rider with minimal attenuation through the softer, upper material of the seat. Cables 154 connect the haptic devices 150, 152 to the control unit 18 for power and activation signals.

Figure 13:
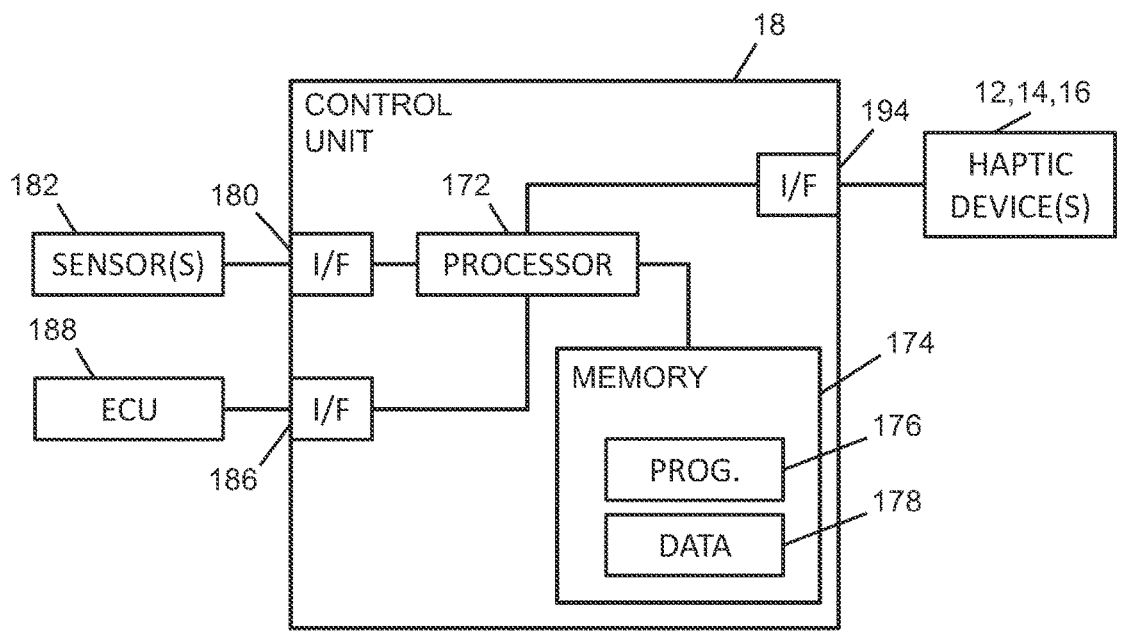
FIG. 13 is a schematic block diagram of a control unit for the haptic devices, according to an embodiment of the present invention.

Referring to FIG. 13, the control unit 18 is shown. The control unit 18 includes a processor 172 and a computer readable memory 174. The memory 174 stores computer readable instructions 176 in the form of a program, and also stores data 178. Various interfaces are included, such as one or more interfaces 180 for connecting sensors 182 to the control unit 18, one or more interfaces 186 for connecting the ECU 188 to the control unit, and one or more interfaces 194 for connecting the haptic devices 12,14, 16 to the control unit. Further interfaces are included in other embodiments, such as an interface to the internet or a cellular data service. This is for receiving information on hazards that are stored remotely, or for receiving updates to the program of the control unit.

Sensors include sensors for detecting the environment of the rider, and include one or more of a forward looking camera, a rearward looking camera, a sideways looking camera, a stereo vision camera, radar, lidar, a microphone and an infrared detector. Sensors 182 may also include one or more sensors for detecting the state of the rider, such as pressure or force sensors distributed throughout the seat, pressure or force sensors in the handlebars, and pressure or force sensors in the footpegs. The sensors for detecting the state of the rider detect the rider's position on the seat, e.g. whether neutral, forward, rearward, left or right. They can also detect the rider's ability level, comfort level, and intentions, such as the intention to turn before the handlebars are actually moved.

Information the processor 172 obtains from the ECU 188 include speed, throttle setting, GPS (Global Positioning System) coordinates etc.

The program 176, when executed by the processor 172, monitors signals from the various inputs to the control unit 18, i.e. it monitors signals from the sensors 182, the ECU 188 and/or from any other external source of data. The program compares signals to predetermined thresholds or thresholds which are combinations of individual thresholds stored in the data 178, in order to detect a hazard condition. If a condition is detected, the processor sends one or more signals to the haptic devices 12, 14, 16 in order to activate them, according to an activation pattern stored in the data 178.

Figure 14:
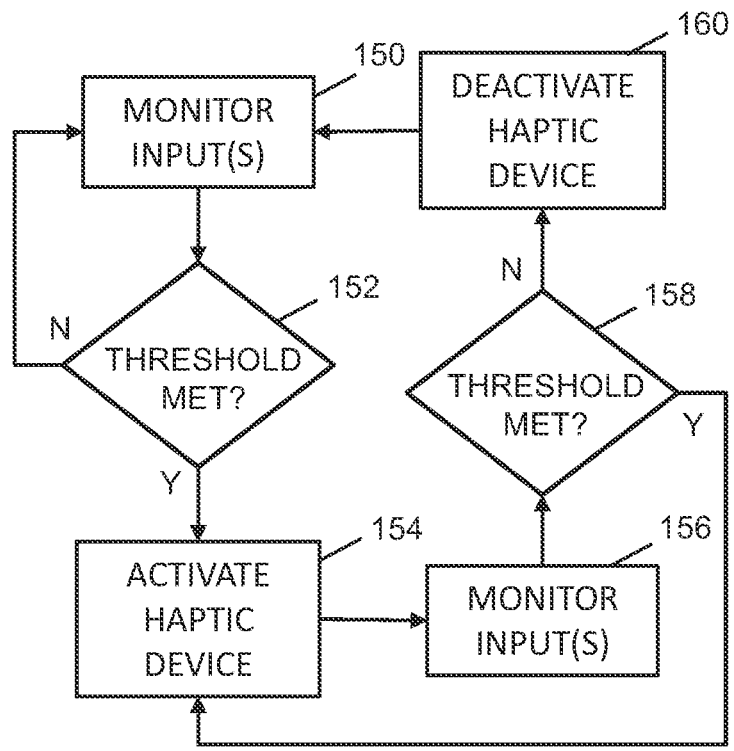
FIG. 14 is a flowchart of an exemplary process that the control unit performs, according to an embodiment of the present invention.

FIG. 14 shows an example of the process that the control unit 18 performs. In step 150, the processor monitors the inputs received via one or more of the interfaces. In step 152, the processor determines whether a threshold has been met for one of the hazards that the control unit has been programmed to recognize. If, in this step, a threshold has not been met, the process reverts to step 150. If, however, a threshold has been met, the process advances to step 154, in which one or more of the haptic devices is activated. In step 156, the processor continues to monitor the inputs. If, in step 158, the threshold is still met, then the process reverts to step 154, in which the haptic devices continue to be activated. However, if the threshold is no longer met, then, in step 160, the haptic devices are deactivated. By activation of the haptic devices, it is to be understood that they are driven continually or with a series or pattern of pulses.

Figure 15:
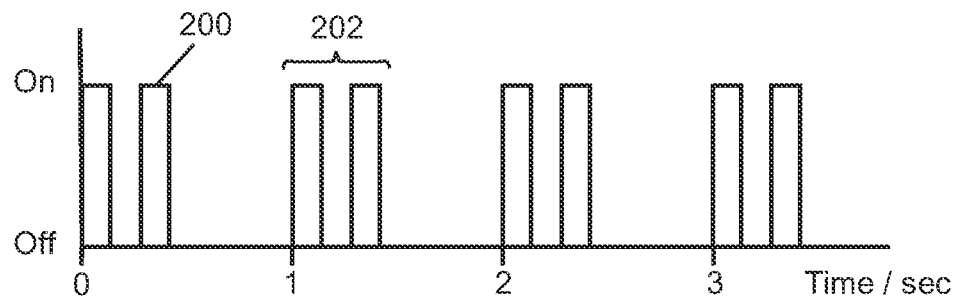
FIG. 15 is a graph of an exemplary activation pattern of a haptic device, according to an embodiment of the present invention.

FIG. 15 shows an example of an activation pattern of the haptic devices 12, 14, 16. In this pattern, the haptic devices are activated with relatively short pulses 200 in pairs 202. The double pulses 202 are repeated every second as long as the hazard persists. When the pulse is applied, the motor 82, if used, is activated so that it rotates at 3000 rpm, providing 50 Hz vibrations. If a pulse is required that is more intense, a higher rotational speed may be used. Conversely, if a pulse is required that is less intense, a lower rotational speed may be used. In other embodiments, other rotational speeds may be used.

Figure 16:
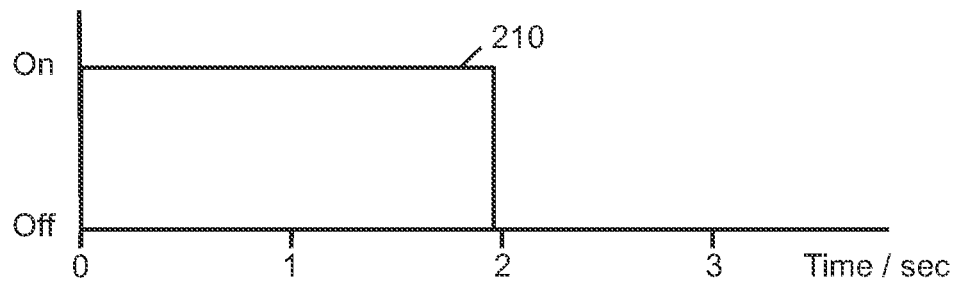
FIG. 16 is a graph of another activation pattern of a haptic device, according to an embodiment of the present invention.

FIG. 16 shows an example of an activation pattern of the haptic devices 12, 14, 16 when the hazard is more severe, for example. In this pattern, the haptic devices are activated continually 210 as long as the hazard persists. The intensity of the pulse may be made stronger, for example by changing the rotational speed of the motor.

There are different activation patterns according to the type of the message that is to be conveyed to the rider. TABLE 1 shows examples of haptic alert patterns. For example, the haptic alert pattern may be a double pulse that is repeated simultaneously on both sides of the motorcycle, a continuous pulse on both sides of the motorcycle, a long pulse on the right side of the motorcycle, or a long pulse on the left side of the vehicle. The intended action that is conveyed by a given alert pattern is the same, even though the alert message may be given in different situations. A repeated double pulse activation pattern signifies to the rider to slow down without applying the brakes. A continuous pulse on both sides indicates that the rider should brake hard. A long right pulse indicates that the rider should swerve to the right. A long left pulse indicates that the rider should swerve to the left.

TABLE 1

| | Haptic Alert Pattern | | | |
|---|---|---|---|---|
| | Two pulse, both sides | Long, both sides | Long right | Long left |
| | Intended action | | | |
| Scenario | Roll off throttle | Brake hard | Swerve right | Swerve left |
| | Reason for alert | | | |
| Tailgating | Car ahead continues at same speed | Car ahead brakes hard, but sufficient space to brake safely | Car ahead brakes hard and car behind is too close | Car ahead brakes hard and car behind is too close. |
| Entering intersection | One or more threat cues identified | Turning car violates rider's right of way, but sufficient space to brake safely | Turning car violates rider's right of way, and car behind is too close | Turning car violates rider's right of way, and car behind is too close. |

One scenario where the alerts are given is when the rider is tailgating, i.e. when both the rider and the car in front are travelling at the same speed and the gap between the two is generally too small for the rider to stop comfortably. It also applies to scenarios where the rider is coming into a tailgating situation. If the car ahead continues at the same speed, the rider is given a two-pulse alert, indicating that he should roll off the throttle. If the car ahead starts to brake hard and there is sufficient room to stop, then the rider is given a continuous pulse from the haptic devices on both sides of the motorcycle. If the car ahead starts to brake hard and a car behind is too close for the rider to stop in safety, then the rider is given a continuous pulse from the haptic devices on either the left side or the right side of the motorcycle, corresponding to the direction in which the rider should swerve.

Another scenario where the alerts are given is when the rider is entering an intersection, which may be detected by a GPS sensor, for example. A car in the opposing direction to the rider is in the left turn lane, waiting to make a left turn after the rider has passed. The sensors on the motorcycle detect one or more threat cues, which include the fact that the car is creeping, the fact that there is enough room between the rider and the car for the driver of the car to consider turning in advance of the rider, and the fact that the car's front wheels are angled to its left. If one or more threat cues are detected but the car is not yet impeding the rider's right of way, the rider is given a two-pulse alert, indicating that he should roll off the throttle. If the car ahead violates the rider's right of way and there is sufficient room to stop safely, then the rider is given a continuous pulse from the haptic devices on both sides of the motorcycle. If the car ahead violates the rider's right of way and a car behind the rider is too close for the rider to stop in safety, then the rider is given a continuous pulse from the haptic devices on either the left side or the right side of the motorcycle, corresponding to the direction in which the rider should swerve. This scenario also corresponds to the case where there is no intersection but there is an oncoming car waiting to turn left after the rider has passed, for example onto a residential or commercial property.

The haptic communication language of Table 1 can be extended or modified. For example, different duty cycles of the alert signals may be used. Sensors on the motorcycle may detect a vehicle in the rider's blind spot and a haptic device can alert the rider in response, either on the left side or right side depending on which side the hazard vehicle is. Sensors can detect that the rider intends to overtake when it is not safe to do so, and the haptic devices can warn the rider not to proceed with the manoeuver. Haptic signals can be given to the rider if a curve is being approached too aggressively, or if the rider is going too fast for the current road conditions. Haptic signals may be given to the rider to instruct him to lean more or lean less when a curve is being taken. A signal of one pulse per second may be used to inform the rider of a warning rather than a hazard.

D. Variations

While the best presently contemplated mode of carrying out the subject matter disclosed and claimed herein has been described, other variations are also possible.

For example, the haptic signals may be augmented with visual signals provided by LEDs (light emitting diodes). Audible alerts may also be given to the rider as well as the haptic alerts. Visible and audible signals may be simultaneous with the haptic signals.

The haptic signaling devices may be used for notifying the rider of situations that are not hazardous, or are not warnings. Also, the haptic devices may be activated in a training mode so that the rider becomes accustomed to the feel of the haptic signals in a safe environment.

It is possible to locate the eccentrically rotating mass 86 inside the handlebar, rather than beyond the end 80 of the handlebar tube 72.

Other sources of vibration may be used, such as an electromagnetically oscillating arm.

Although the present invention has been illustrated principally in relation to two-wheeled motorcycles, it has application in respect of three-wheeled motorcycles.

Sending a signal can be interpreted to be either the actual creation of a signal that is transmitted from a sensor or the ceasing of a signal that is being created by and transmitted from the sensor. Either way, the change in output of the sensor can be interpreted as a signal. A null signal may also be considered to be a signal. The signal may, for example, be a change in voltage, resistance, capacitance or current. In other cases the signal may be an image or a change in an image.

In general, unless otherwise indicated, singular elements may be in the plural and vice versa with no loss of generality. The use of the masculine can refer to masculine, feminine or both.

Throughout the description, specific details have been set forth in order to provide a more thorough understanding of the invention. However, the invention may be practiced without these particulars. In other instances, well known elements have not been shown or described in detail and repetitions of steps and features have been omitted to avoid unnecessarily obscuring the invention. Accordingly, the specification and drawings are to be regarded in an illustrative, rather than a restrictive, sense.

It will be clear to one having skill in the art that further variations to the specific details disclosed herein can be made, resulting in other embodiments that are within the scope of the invention disclosed. Other steps may be added to the flowcharts, or one or more may be removed without altering the main function of the haptic alert system described herein. Modules may be divided into constituent modules or combined into larger modules. All parameters, dimensions, materials, and configurations described herein are examples only and actual values of such depend on the specific embodiment. Accordingly, the scope of the invention is to be construed in accordance with the substance defined by the following claims.

The invention claimed is:

1. A motorcycle comprising:
a haptic device mounted in a left handlebar of the motorcycle and a haptic device mounted in a right handlebar of the motorcycle, said haptic devices configured to provide haptic feedback to a rider of the motorcycle; and
a control unit connected to the haptic devices, the control unit comprising one or more interfaces for connecting to multiple sensors attached to the motorcycle, the control unit configured to detect signals from the multiple sensors and thereby;
detect that an oncoming vehicle is turning;
detect that the oncoming vehicle violates a right of way of the rider;
detect, in response to detecting that the oncoming vehicle violates the rider's right of way, either that there is sufficient space for the rider to brake safely or that a vehicle behind the motorcycle is too close for the rider to stop safely; and
activate the haptic devices in a first pattern when there is sufficient space for the rider to brake safely and in a second pattern when the vehicle behind the motorcycle is too close for the rider to stop safely.

2. The motorcycle of claim 1, wherein:
the first pattern is a simultaneous activation of the haptic devices; and
the second pattern is an activation of only one of the haptic devices.

3. The motorcycle of claim 1, wherein:
the first pattern is a simultaneous, continuous activation of the haptic devices; and
the second pattern is a continuous activation of only one of the haptic devices.

4. The motorcycle of claim 1, wherein the control unit is configured to:
detect that an opposing vehicle is waiting to turn left;
detect one or more threat cues related to the opposing vehicle;
detect that the opposing vehicle is not impeding the rider's right of way; and
in response, activate the haptic devices in a third pattern.

5. The motorcycle of claim 4, wherein the one or more threat cues include:
the opposing vehicle is creeping forwards;
there is enough room between the motorcycle and the opposing vehicle for a driver of the opposing vehicle to consider turning in advance of the motorcycle; and
front wheels of the opposing vehicle are angled in a direction of the opposing vehicle's turn.

6. The motorcycle of claim 1, wherein the control unit is configured to compare the signals to thresholds stored in the control unit, wherein each threshold represents a hazardous condition.

7. The motorcycle of claim 6, wherein the control unit detects that there is sufficient space for the rider to brake safely or that the vehicle behind the motorcycle is too close for the rider to stop safely by comparing at least one of the signals to at least one of the thresholds.

8. The motorcycle of claim 6, wherein at least some of the multiple sensors detect values of parameters of an environment in which the motorcycle is present, and at least some of the thresholds are based on the parameters.

9. The motorcycle of claim 6, wherein the control unit is configured to activate at least one of said haptic devices when one of said thresholds is met; and deactivate the activated haptic device or devices when the met threshold is no longer met.

10. The motorcycle of claim 6, wherein at least one of the multiple sensors detects a parameter of the rider, and at least one of the thresholds is based on the parameter of the rider.

11. The motorcycle of claim 6, wherein:
the control unit comprises an interface for connection to an engine control unit of the motorcycle;
the control unit is configured to obtain data regarding a state of the motorcycle; and
at least one of the thresholds is based on the state of the motorcycle.

12. A method for warning a rider of a motorcycle of a hazard, comprising:
receiving, by a control unit connected to the motorcycle, signals from multiple sensors attached to the motorcycle;
comparing, by the control unit, the signals to thresholds stored in the control unit;
detecting that an oncoming vehicle is turning;
detecting that the oncoming vehicle violates a right of way of the rider;
detecting, in response to detecting that the oncoming vehicle violates the rider's right of way, either that there is sufficient space for the rider to brake safely or that a vehicle behind the motorcycle is too close for the rider to stop safely; and
activating haptic devices in a first pattern when there is sufficient space for the rider to brake safely and in a second pattern when the vehicle behind the motorcycle is too close for the rider to stop safely.

13. The method of claim 12, wherein:
the first pattern is a simultaneous activation of the haptic devices; and
the second pattern is an activation of only one of the haptic devices.

14. The method of claim 12, wherein:
the first pattern is a simultaneous, continuous activation of the haptic devices; and
the second pattern is a continuous activation of only one of the haptic devices.

15. The method of claim 12, comprising:
detecting that an opposing vehicle is waiting to turn left;
detecting one or more threat cues related to the opposing vehicle;

detecting that the opposing vehicle is not impeding the rider's right of way; and in response, activating the haptic devices in a third pattern.

16. The method of claim 15, wherein the one or more threat cues include:

the opposing vehicle is creeping forwards;

there is enough room between the motorcycle and the opposing vehicle for a driver of the opposing vehicle to consider turning in advance of the motorcycle; and front wheels of the opposing vehicle are angled in a direction of the opposing vehicle's turn.

17. The method of claim 12, wherein the control unit detects that there is sufficient space for the rider to brake safely or that the vehicle behind the motorcycle is too close for the rider to stop safely by comparing at least one of the signals to at least one of the thresholds.

18. The method of claim 12, comprising:

detecting, by at least some of the multiple sensors, values of parameters of an environment in which the motorcycle is present;

detecting, by at least some of the multiple sensors, a parameter of the rider;

obtaining data from an engine control unit of the motorcycle; and basing at least some of the thresholds on the values of parameters of the environment, the parameter of the rider or the data from the engine control unit.

19. A kit of parts for attachment to a motorcycle, the kit comprising:

a haptic device configured to mount in a left handlebar of the motorcycle and provide haptic feedback to a rider of the motorcycle;

another haptic device configured to mount in a right handlebar of the motorcycle and provide haptic feedback to the rider;

a control unit configured to:

mount on the motorcycle;

connect to the haptic device(s);

detect signals from multiple sensors attached to the motorcycle;

compare the signals to thresholds stored in the control unit, wherein each threshold represents a hazardous condition, and at least some of the sensors detect values of parameters of an environment in which the motorcycle is present, and at least some of the thresholds are based on the parameters;

activate at least one of said haptic devices when one of said thresholds is met;

deactivate the activated haptic device or devices when the met threshold is no longer met;

detect that an oncoming vehicle is turning;

detect that the oncoming vehicle violates a right of way of the rider;

detect, in response to detecting that the oncoming vehicle violates the rider's right of way, either that there is sufficient space for the rider to brake safely or that a vehicle behind the motorcycle is too close for the rider to stop safely; and activate the haptic devices in a first pattern when there is sufficient space for the rider to brake safely and in a second pattern when the vehicle behind the motorcycle is too close for the rider to stop safely.

20. The kit of claim 19, wherein the control unit is configured to:

detect that an opposing vehicle is waiting to turn left;

detect one or more threat cues related to the opposing vehicle;

detect that the opposing vehicle is not impeding the rider's right of way; and in response, activate the haptic devices in a third pattern.

* * * * *